United States Patent [19]
Johnson et al.

[11] Patent Number: 5,593,506
[45] Date of Patent: Jan. 14, 1997

[54] CLEANING METHOD FOR FOIL

[75] Inventors: Neil A. Johnson, Schenectady; Thomas R. Raber, East Berne; Louis E. Hibbs, Jr., Schenectady; Melissa L. Murray, Schaghticoke; Mark G. Benz, Burnt Hills, all of N.Y.

[73] Assignee: General Electric Company, Schenectady, N.Y.

[21] Appl. No.: 415,804

[22] Filed: Apr. 3, 1995

[51] Int. Cl.⁶ .................................................. B08B 1/02
[52] U.S. Cl. ............................ 134/9; 134/15; 134/32; 134/25.4
[58] Field of Search .................. 134/9, 15, 32, 134/25.4; 72/40

[56] References Cited

U.S. PATENT DOCUMENTS

| | | | |
|---|---|---|---|
| 3,733,692 | 5/1973 | Fietz et al. | 29/599 |
| 3,737,824 | 6/1973 | Coles | 336/200 |
| 4,145,231 | 3/1979 | Heckman | 134/9 |
| 5,472,936 | 12/1995 | Benz et al. | 148/98 |

FOREIGN PATENT DOCUMENTS 1342726  2/1970  United Kingdom .

OTHER PUBLICATIONS

"Binary Alloy Phase Diagrams", 2nd Edition, ASM International (1990), p. 2771 no month.
"Efffect of Oxygen and Zirconium on the Growth and Superconducting Properties of Nb3Sn", L. E. Rumaner, Masters Thesis, CRD Technical Report, 91CRD124, Jun. 1991, pp. 1–135.

*Primary Examiner*—Zeinab El-Arini
*Attorney, Agent, or Firm*—Noreen C. Johnson; William H. Pittman

[57] ABSTRACT

Foil used in the manufacture of superconductor material is cleaned using a mechanical abrasive pad that produces longitudinal hills and valleys or elliptical swirls on the surface of both sides of the foil to yield high quality and uniform superconductors.

8 Claims, 3 Drawing Sheets

CLEANING METHOD FOR FOIL

FIELD OF THE INVENTION

This invention relates to a method for cleaning the surface of foil used in the manufacture of superconductor materials. In particular, this invention is directed to abrasive surface conditioning of niobium-based foil that is used in the production of triniobium tin superconductors.

BACKGROUND OF THE INVENTION

The intermetallic compound triniobium tin, $Nb_3Sn$, is a type-II metallic superconductor of interest because it has high values of superconducting critical current density in high magnetic fields. In order to achieve high critical current density, the process chosen to form the triniobium tin superconductor is important. One process currently used is a liquid-solid phase diffusion method. This occurs by diffusion between a solid niobium phase and a liquid tin phase.

To form triniobium tin superconductors by liquid-solid diffusion requires multiple steps. The first step in forming triniobium tin superconductor is to clean the niobium or niobium based substrate. Historically, this is done with a cleaning solution or etchant, such as a mixture of nitric acid, hydrochloric acid, and water. Diluted hydrofluoric acid is also sometimes used for cleaning the substrate. After the substrate is cleaned, oxygen may be added to the surface of the substrate by anodizing the surface electrolytically.

The next three steps involve high temperature heat treatments. The first anneal, as taught by Caslaw in British patent 1,342,726, is used to introduce a desired oxygen content into the niobium substrate. This is accomplished by passing the substrate through a furnace at about 950° C. for about 30 seconds in an atmosphere containing argon and oxygen. However, if the substrate has been previously anodized to form an oxide layer on the surface of the substrate, then the preheat is called a decomposition anneal whereby the substrate is annealed so that the oxide layer diffuses into the body of the substrate.

After the preheat, the substrate is dipped in a tin or tin alloy bath, which supplies the tin for the triniobium tin reaction. The tin coating from the bath has a limiting thickness due to the amount of tin needed to further react with the niobium. Subsequently, the tin coated niobium substrate is treated with a reaction anneal to react the tin coating and the niobium base metal. During this final anneal, a layer of superconducting triniobium tin is formed on both sides of the niobium substrate.

In the above-mentioned steps the initial cleaning of the foil surface is important. A clean, unstained foil surface allows successful subsequent processing of the foil to form the triniobium tin superconductor. When the foil is not properly cleaned, surface staining from incomplete rinsing and drying of the foil after acid cleaning may occur. Stained foil cannot successfully be processed through all the necessary steps to make satisfactory triniobium tin tape. For instance, the amount of oxygen added during a subsequent anodization process is diminished in stained areas, reducing the thickness of the superconducting layer and lowering the critical current in those stained areas. Further, the tin alloy, which is also necessary for the formation of the superconductor, does not always wet the niobium foil surface in stained areas. This leaves areas on the foil where there is no superconducting material formed during the final reaction anneal.

There is a need for a method of cleaning the foil which would provide foil with a contaminant-free, uniform surface for subsequent superconductor process steps. There is also a need for a cleaning method that is compatible with the environment by eliminating the use of acids. Also, there is a need to reduce the cost of the manufactured tape by increasing the superconducting material yield.

SUMMARY OF THE INVENTION

This invention provides a method for cleaning foil to be used in manufacturing superconductor material that comprises passing continuously at a uniform speed, the foil having a thickness greater than about 0.0005 inches, between an abrasive pad and a smooth backing roller, where the abrasive pad contacts a top surface of the foil with an applied pressure that produces an effective amount of scratches to remove substantially all of a contaminant layer from the top surface of the foil; and then repeating the above-mentioned step on a bottom surface of the foil, so that the abrasive pad contacts the bottom surface of the foil with the applied pressure that produces the effective amount of scratches to remove substantially all of the contaminant layer from the bottom surface of the foil.

An effective amount of scratches to remove the contaminant layer on the surface of the foil is an amount that removes staining, particles, and oxides, so that further treatment, such as anodization and tin dipping processes, occur uniformly on the surface of the foil.

Abrasive cleaning of the foil improves the formation and quality of the superconductor. Staining of the foil from acid cleaning does not occur. Thus, subsequent treatments of the surface of the foil, such as anodization and tin wetting for triniobium tin superconductor, are increased, leading to high quality superconducting material.

Additionally, this invention eliminates the use of caustic acids from the cleaning process. As a result, handling and disposal of the acids no longer pose problems. This decreases manufacturing costs while having an environmental benefit.

DESCRIPTION OF THE INVENTION

The quality and uniformity of superconductor tape is improved by mechanically abrading the surface of the foil to remove oxide layers and dirt contaminants prior to subsequent treatments to form the superconducting material. Hazardous acid cleaning of the foil is replaced with abrasive pads that not only remove contaminants from the surface of the foil, but also roughen the surface with scratches so that better wetting and adhesion of metals to the foil's surface occur.

This invention is described herein for the manufacture of triniobium tin superconductor. However, it is also contemplated that the method of this invention is applicable to the cleaning of foil for use in manufacturing other superconducting materials. For example, with regard to metallic superconductors, it is known that selected parent-metals, either pure or preferably containing minor solute-metal alloying additions, are capable of being alloyed with other reactive metals and forming superconducting compounds or alloys that have a high current-carrying capacity. The parent-metals niobium, tantalum, technetium, and vanadium, can be reacted or alloyed with reactive metals, such as tin, aluminum, silicon, and gallium, to form superconducting alloys, such as the intermetallic triniobium tin. Thus, the method of this invention is useful in manufacturing tapes of several different superconductors.

Generally, niobium-based foil first undergoes degreasing to remove slitting oils prior to the cleaning steps of this invention. Then, the surface of the foil is mechanically cleaned by the method of this invention to remove niobium oxides and other contaminants from the surface of the foil.

Figure 1:
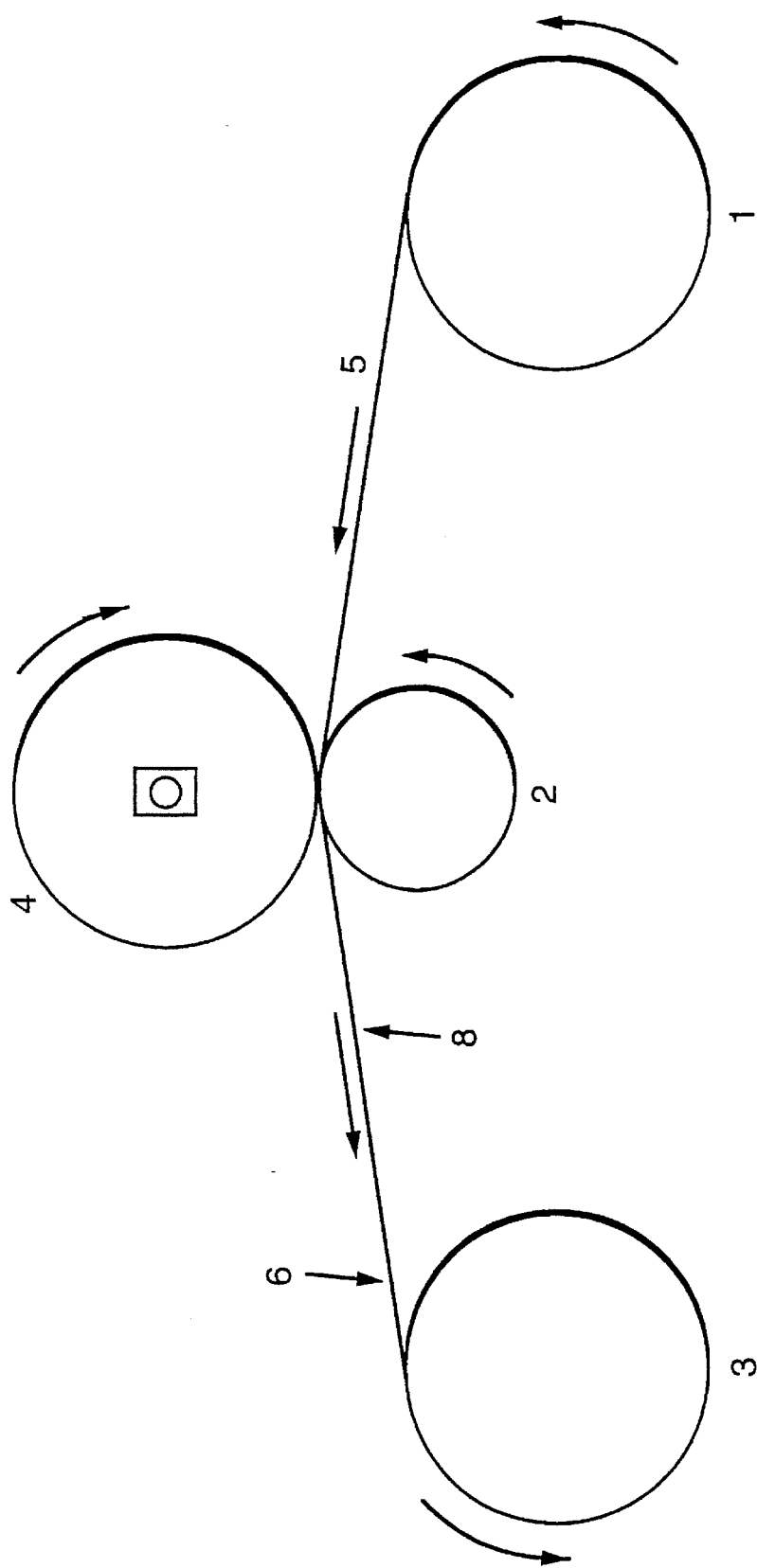
FIG. 1 shows an embodiment of the invention in which one side of the foil passes between an abrasive wheel and a smooth backing roller.

To demonstrate the invention FIG. 1 shows a schematic diagram of a contemplated embodiment. The foil 5 is coiled on a spool 1, herein referred to as a payoff spool, and travels over a smooth backing roller 2 when contacting the abrasive pad 4 to scratch and clean the top surface 6 of the foil. The foil is passed continuously between the abrasive pad 4 and a smooth backing roller 2, so that the abrasive pad 4 is contacting a top or bottom surface of the foil. The abrasive pad 4 and smooth backing roller 2 have codirectional rotation. Because mechanical abrasion is used, a micro-portion of the foil surface is removed. The abraded foil is respooled 3 and then reprocessed by the method of this invention so that the bottom surface 8 of the foil contacts the abrasive wheel 4.

It is contemplated that the smooth backing roller is flat and about the width or a little bit wider than the foil being processed. The backing roller is used to apply slight pressure against the foil so that the foil maintains contact with the abrasive pad. The other purpose of the backing roller is to guide the foil through the operation at a constant speed.

Foil is moved through the abrading operation by the tension between the payoff spool and the takeup spool. The payoff spool can be rotated by a torque motor while the takeup spool can be run by a drive motor. This set-up provides a back tension on the foil to feed it through the abrading operation of this invention.

When the abrasive pad is an abrasive wheel, the abrasive wheel usually rotates in the same direction as the foil is moving.

Figure 2:
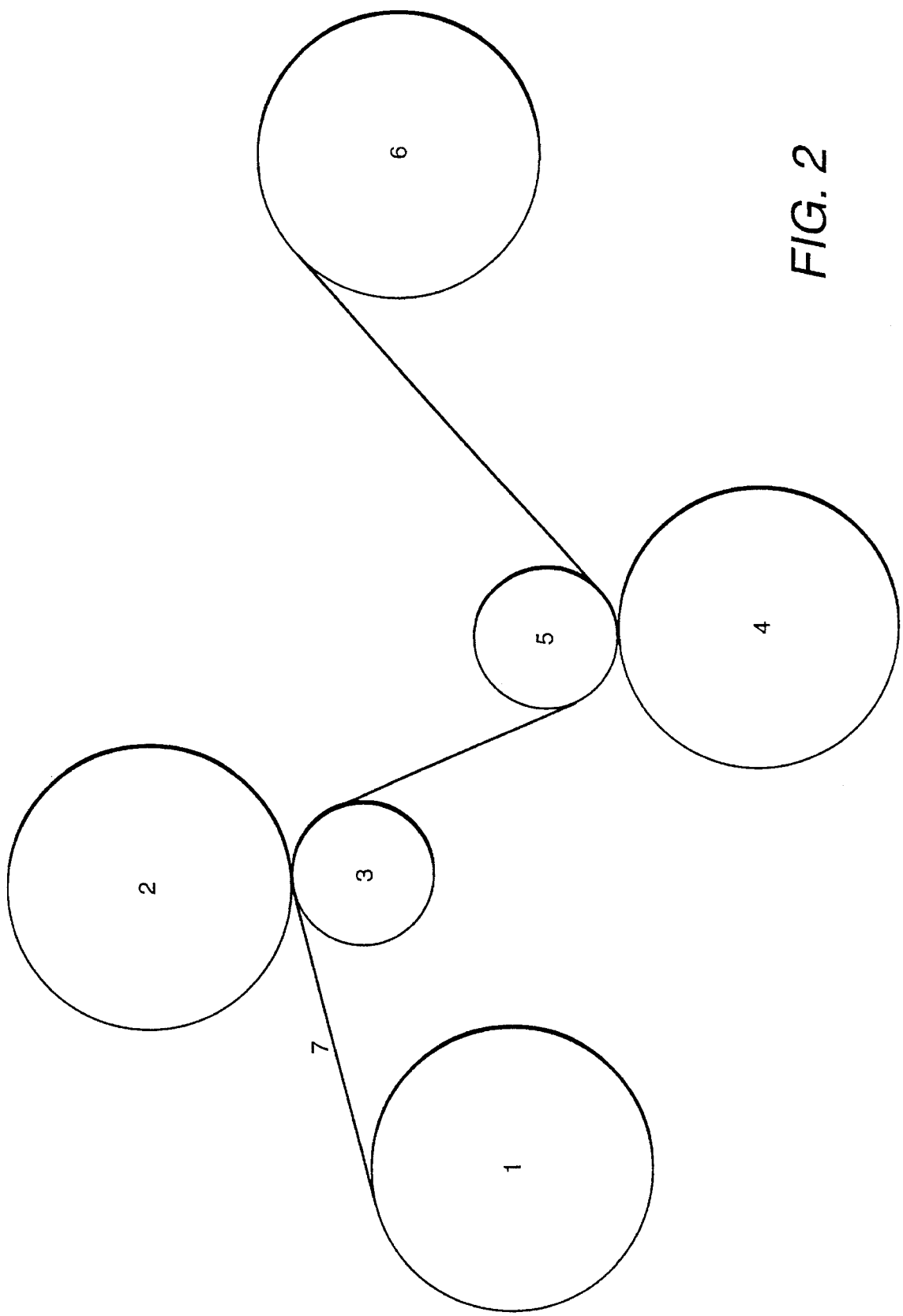
FIG. 2 is an embodiment of the invention in which two sides of the foil pass between an abrasive wheel and smooth backing roller.

In another embodiment of this invention, FIG. 2 demonstrates continuous treatment of the foil so that both sides of the foil are abraded in one operation. The foil 7 is coiled on the payoff spool 1 and first travels between the backing roller 3 and the abrasive pad 2. The foil continues to travel between a second backing roller 5 and abrasive pad 4 that are placed to contact the opposite side of the foil 7 for abrasion. After the foil 7 has passed over both abrasion pads, the foil 7 is then rewound on the takeup spool 6.

Foil that is processed in accordance with this invention can be respooled, stored, and used at a later time in the manufacturing process of triniobium tin. In such cases, the foil should be stored in a low oxygen environment so as to limit the formation of oxides on the surface. A low oxygen environment comprises an inert gas, such as argon or nitrogen, and up to about thirty parts per million oxygen.

The formation of oxides on the surface of treated foil that has been stored for long periods of time in an oxygen atmosphere greater than thirty parts per million oxygen, may reduce the final thickness of the triniobium tin superconductor.

The niobium-based foil preferably contains zirconium in the proportion of at least about one atomic percent. If desired, the percentage of zirconium may be increased up to about eight atomic percent.

Preferably, the thickness of the niobium-based foil is between about 0.0008–0.0012 inches. However, the foil thickness may be from greater than about 0.0005 to about 0.008 inches. The width of the foil depends on the application. Foils may be about 0.5–1.5 inches wide. Usually a one inch wide foil is used in production to produce triniobium tin tape.

Figure 3:
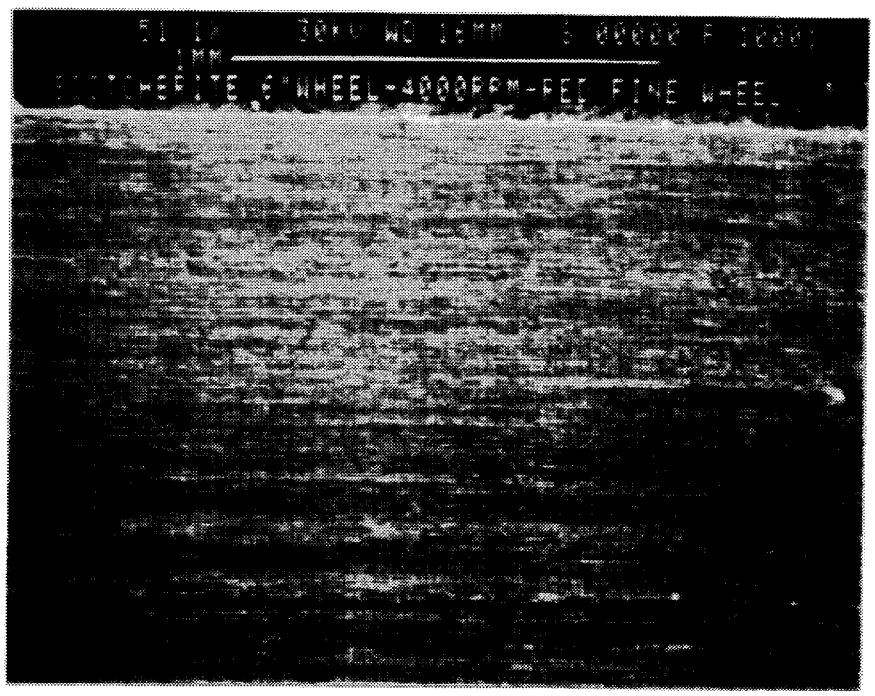
FIG. 3 is a photo of niobium-based foil with longitudinal scratches from a circular abrasive wheel mounted on a roller.
Figure 4:
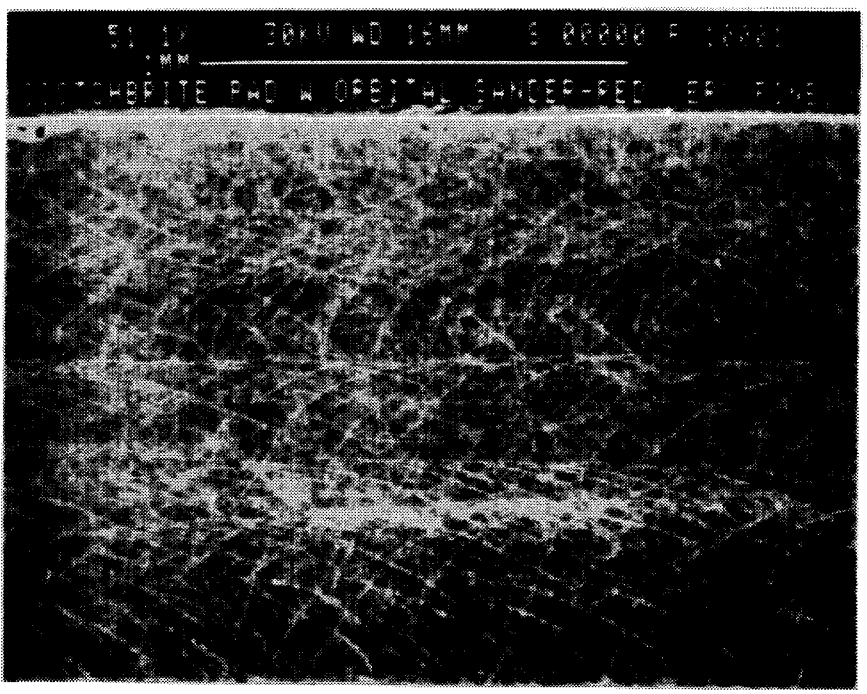
FIG. 4 is a photo of niobium-based foil with elliptical swirl scratches from an abrasive pad mounted on an orbital sander.

Two types of abrasive pads that are contemplated in this invention are an abrasive wheel that produces longitudinal hills and valleys in the surface of the foil on a micro-scale, as shown in FIG. 3, and an abrasive pad mounted on an orbital-type sanding device. This method produces elliptical swirl patterns in the foil surface on a micro-scale, as shown in FIG. 4.

Examples of the composition of the abrasive pad are alumina and silicon carbide. Alumina or silicon carbide are often mixed in a polymer binder. Other materials or commercial products that produce a rough, scratched surface on the foil can also be used, provided they do not contaminate the foil with foreign matter.

Different amounts of grit may be used in the abrasive pad. For instance, fine grit is equivalent to about 240–340 size grit. Medium type grit is about 150–180 size grit. The choice of grit depends on the amount of contaminants on the surface of the foil.

Processing rates of the foil are determined by the relative transport rate and direction of the foil with respect to the rotational speed and direction of the abrasive wheel. For transport rates of about 10–22 feet per minute, rotational speeds of the wheel or roller are about 2200 revolutions per minute. For an abrasive wheel having about six inch diameter, the surface feet per minute is about 3454. For a five inch diameter abrasive wheel, the surface feet per minute is about 2882.

This invention can be utilized in place of acid cleaning of the foil or in conjunction with the acid cleaning. Foil that has been degreased and cleaned with acids first, allow higher processing rates of the foil using the method of this invention because much of the niobium oxide which forms on the surface of the foil has been removed by the acid. Foil that has only been degreased first, will require a slower transport speed to remove the heavier oxide layer effectively.

The following examples further demonstrate the invention.

EXAMPLE

To determine the effectiveness of the cleaning process using abrasive pads, the oxygen content of acid cleaned and abrasive cleaned foils were compared after anodization. The amount of oxygen added during anodization is an indication of the foil surface cleanliness, with greater oxygen concentrations resulting from a cleaner foil surface.

The niobium-1 atomic percent zirconium foil was degreased using a detergent and deionized water rinse.

Samples of the degreased foil about nine inches long were acid cleaned by immersion for ten seconds in an aqueous solution of 10% sulfuric acid, 30% nitric acid, and 8% hydrofluoric acid by volume. The samples were rinsed using warm tap water and then with deionized water and air dried at about 100° C.

A sample, fifteen feet in length, of the degreased material was processed on both sides using the abrasive cleaning technique with an abrasive wheel. Foil transport speed was set at fifteen feet per minute and the abrasive wheel was rotated at 2200 revolutions per minute. This length was then cut into nine inch samples.

Each nine inch sample was statically anodized by immersing the sample in a 0.05 molar solution of sodium sulfate and creating a DC potential of 145 volts between the foil, as the anode, and a stainless steel plate, as a cathode. Oxygen concentration was measured for the foil in the as received condition, after abrasive surface cleaning, and after acid cleaning. Oxygen content was determined using a Leco 136 Oxygen/Nitrogen Analyzer. Results are shown in Tables 1 and 2.

TABLE 1

| | OXYGEN CONTENT IN FOIL (AT %) BEFORE ANODIZATION | |
|---|---|---|
| FOIL | as received oxygen content | oxygen after abrasion |
| 1a | 0.25 ± 0.01 | 0.24 ± 0.01 |

TABLE 2

| | OXYGEN CONTENT IN FOIL (AT %) AFTER ANODIZATION | | |
|---|---|---|---|
| FOIL | as received | acid cleaned | abrasive cleaned |
| 1a | 2.35 ± 0.00 | 3.05 ± 0.08 | 2.95 ± 0.01 |

As shown in Table 1, the cleaning of the foil surface using the abrasive technique did not change the oxygen content of the foil.

The results in Table 2 show that the oxygen added to the foil cleaned with the abrasive method is nearly equal to the oxygen concentration measured in the acid cleaned foil. The oxygen in the uncleaned foil is lower since the niobium oxide on the surface of the foil reduces the DC potential that can be applied across the foil and hence a thinner anodic film is formed.

What is claimed:

1. A method for cleaning niobium-based foil that is used to produce superconducting material comprising the steps of:
   (a) passing continuously at a uniform speed, the foil having a thickness greater than about 0.0005 inches, between an abrasive pad and a smooth backing roller, where the abrasive pad contacts a top surface of the foil with an applied pressure from the smooth backing roller pressing against the foil so that the foil maintains contact with the abrasive pad to produce an effective amount of scratches to remove substantially all of a contaminant layer from the top surface of the foil; and then
   (b) repeating step (a) on a bottom surface of the foil, so that the abrasive pad contacts the bottom surface of the foil with the applied pressure that produces the effective amount of scratches to remove substantially all of the contaminant layer from the bottom surface of the foil.

2. A method according to claim 1 where the foil is a niobium-based foil.

3. A method according to claim 2 where the niobium-based foil consists essentially of niobium and one atomic percent zirconium.

4. A method according to claim 1 where the thickness of the foil is between about 0.0008–0.0012 inches.

5. A method according to claim 1 where the abrasive pad is selected from a group consisting of an abrasive wheel and a flat pad mounted on a sanding device.

6. A method according to claim 1 where the abrasive pad contains grit between about 150–340 grit size.

7. A method according to claim 1 where the abrasive pad has a composition selected from a group consisting essentially of alumina oxide, silicon carbide, and mixtures thereof.

8. A method to clean niobium-based foil comprising the stepsot passing the foil between a first abrasive pad and a first back supporting surface to contact a top area of the foil with the abrasive pad to remove a top contaminated surface layer, where the first abrasive pad contacts the top area of the foil with an applied pressure from the first back supporting surface; and then passing the foil between a second abrasive pad and a second back supporting surface to contact a bottom area of the foil with the second abrasive pad to remove a bottom contaminated surface layer, where the second abrasive pad contacts the bottom area of the foil with the applied pressure from the second back supporting surface.

* * * * *